United States Patent
Tsao

(10) Patent No.: US 9,049,776 B2
(45) Date of Patent: Jun. 2, 2015

(54) LATCHING MODULE FOR HOUSING OF PORTABLE ELECTRONIC DEVICE

(71) Applicant: Chi Mei Communication Systems, Inc., New Taipei (TW)

(72) Inventor: Chang-Wei Tsao, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 142 days.

(21) Appl. No.: 13/873,225

(22) Filed: Apr. 30, 2013

(65) Prior Publication Data

US 2013/0322015 A1 Dec. 5, 2013

(30) Foreign Application Priority Data

May 29, 2012 (TW) .............................. 101119073 A

(51) Int. Cl.
G06F 1/16 (2006.01)
H05K 5/00 (2006.01)
H04M 1/02 (2006.01)

(52) U.S. Cl.
CPC ........... *H05K 5/0013* (2013.01); *H04M 1/0249* (2013.01); *G06F 1/16* (2013.01); *H04M 1/0283* (2013.01)

(58) Field of Classification Search
USPC ............ 345/204, 208, 211, 214; 361/679.01, 361/679.37, 679.58, 679.33, 679.42, 361/679.41, 679.26, 679.59, 679.32, 679.4, 361/679.2, 679.06, 679.09, 679.17; 29/726, 29/592.1, 825, 401.1, 434, 417, 564.6, 29/429; 439/350, 701, 160, 391, 159, 330; 200/318, 523, 50.21, 50.26, 502; 248/221.11, 218.4, 917, 923, 588, 575, 248/278.1, 396, 121

See application file for complete search history.

(56) References Cited

U.S. PATENT DOCUMENTS

| | | | |
|---|---|---|---|
| 6,947,279 B2 * | 9/2005 | Cheng et al. | 361/679.06 |
| 7,984,881 B2 * | 7/2011 | Liu et al. | 248/121 |
| 2005/0225093 A1 * | 10/2005 | Zuo et al. | 292/1 |
| 2008/0122229 A1 * | 5/2008 | Choi et al. | 292/216 |

* cited by examiner

*Primary Examiner* — Hung Duong
(74) *Attorney, Agent, or Firm* — Novak Druce Connolly Bove + Quigg LLP

(57) ABSTRACT

A latching module for latching two housings together includes a rotary member, a compression spring, an elastic sheet, and a magnetic member. The rotary member is attached to one housing, and includes a first surface, a second surface opposite to the first surface, and a peripheral surface. The first surface defines a first receiving hole and a curved groove. The second surface defines a second receiving hole communicating with the first receiving hole. A latching projection extends from the peripheral surface. The compression spring is received in the second receiving hole. The elastic sheet is attached to the peripheral surface. The magnetic member is received in the curved groove. The magnetic member is attracted by another magnet to rotate the latching projection into a latch in another housing.

7 Claims, 7 Drawing Sheets

LATCHING MODULE FOR HOUSING OF PORTABLE ELECTRONIC DEVICE

BACKGROUND

1. Technical Field

The present disclosure relates to latching modules, and particularly to a latching module for connecting a first housing and a second housing of portable electronic devices.

2. Description of Related Art

Currently, portable electronic devices such as mobile phones, laptops and personal digital assistants (PDAs) incorporate at least two housings.

Typical housings of a portable electronic device include an upper housing and a lower housing. The upper housing may be fixed to the lower housing by bolts. The bolts are often exposed on the outside of the portable electronic device. However, the bolts affects the device appearance, and such connection mechanisms are not suitable for thin portable electronic devices.

Therefore, there is room for improvement within the art.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the exemplary latching module and portable electronic device using the latching module. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
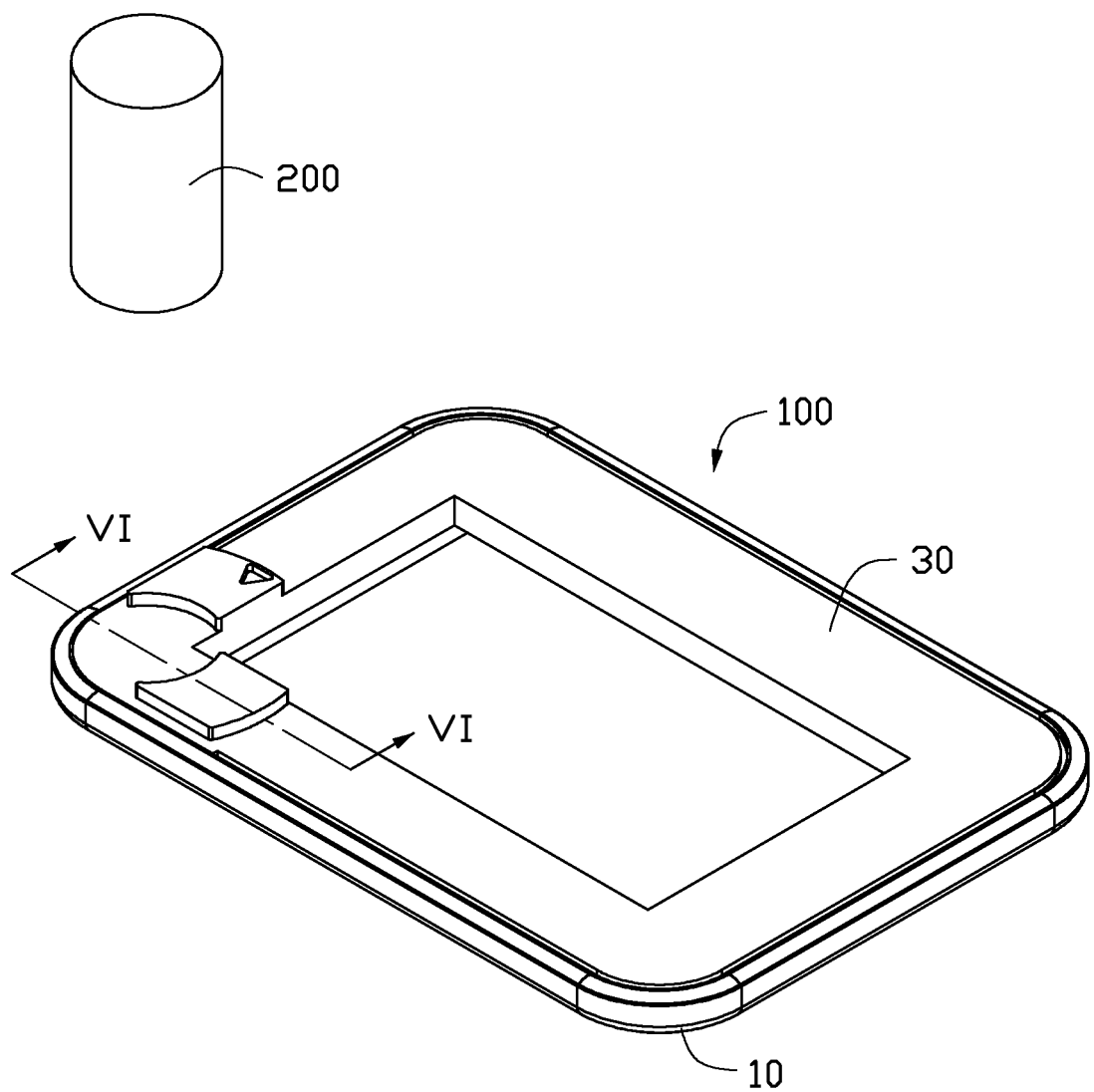
FIG. 1 is a schematic view of one embodiment of a latching module used in a portable electronic device
Figure 2:
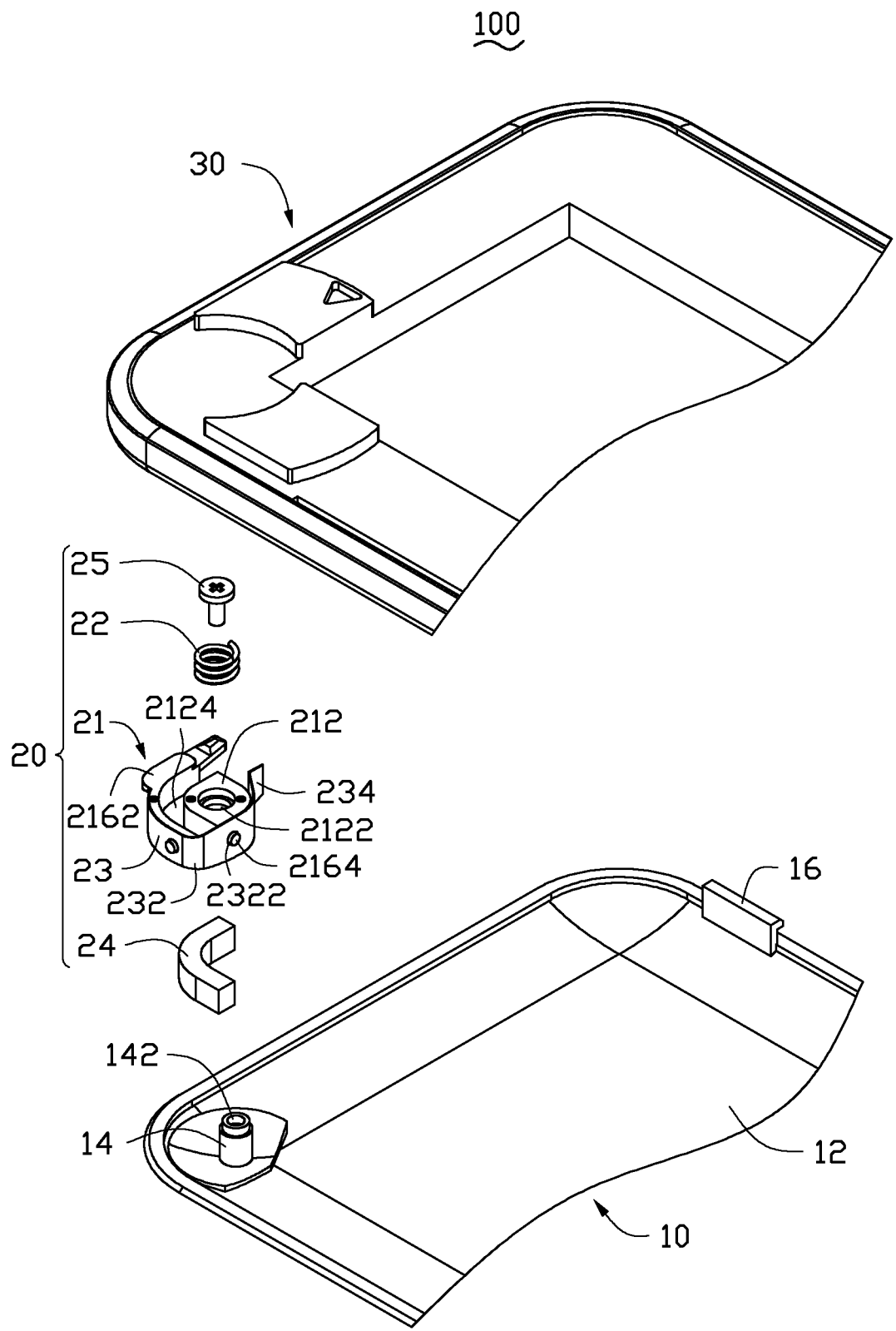
FIG. 2 is an exploded view of the latching module and the portable electronic device.

FIGS. 1 and 2 show an exemplary embodiment of a latching module 20 which can be used in a portable electronic device 100, such as a tablet computer or any electronic device.

The portable electronic device 100 comprises a first housing 10 and a second housing 30. The second housing 30 is secured to the first housing 10 through the latching module 20.

The first housing 10 has a post 14 and a plurality of hooks 16 at an inside surface 12. In this exemplary embodiment, the post 14 defines a threaded hole 142.

Figure 3:
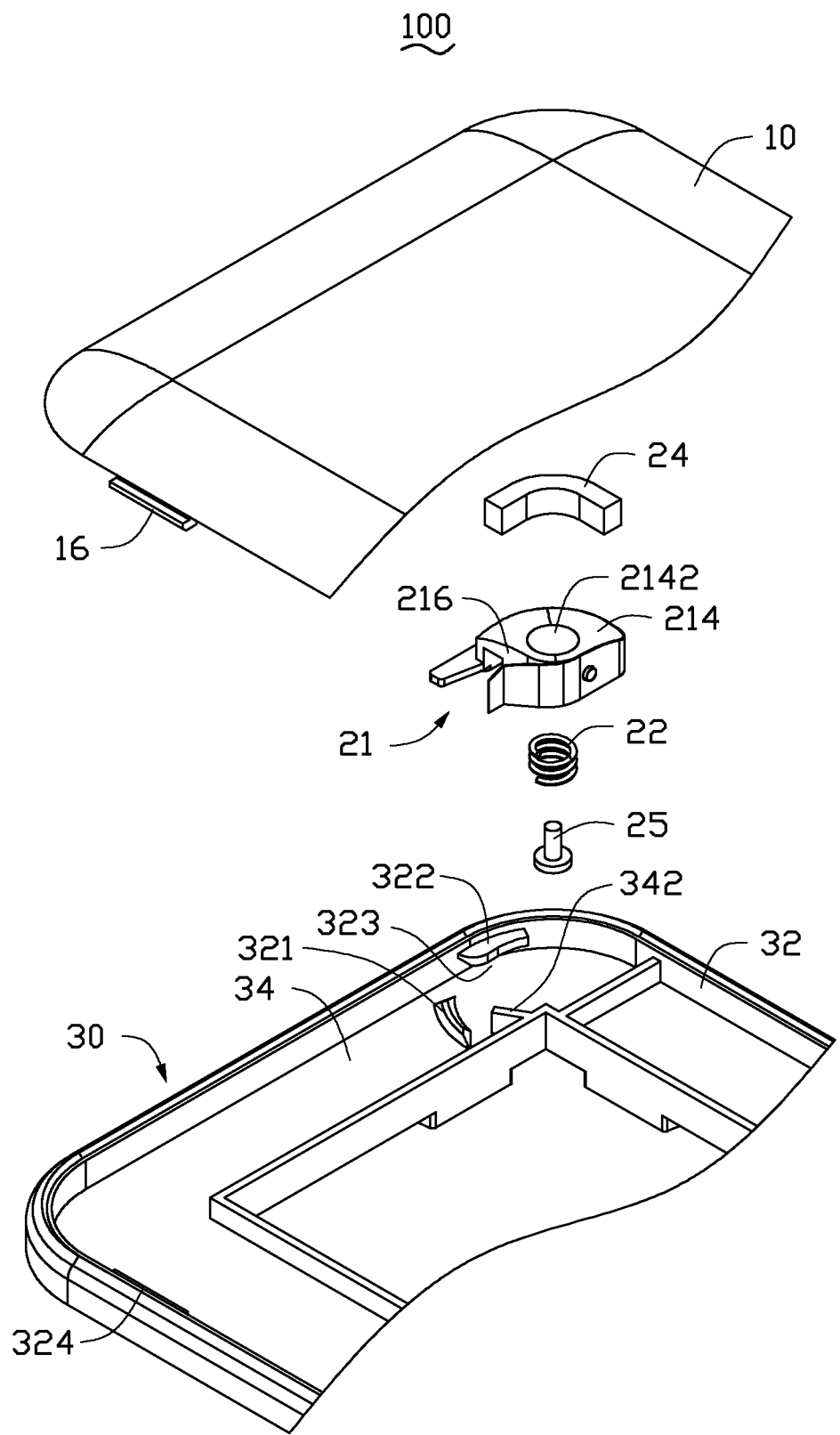
FIG. 3 is similar to FIG. 1, but viewed from another aspect.
Figure 4:
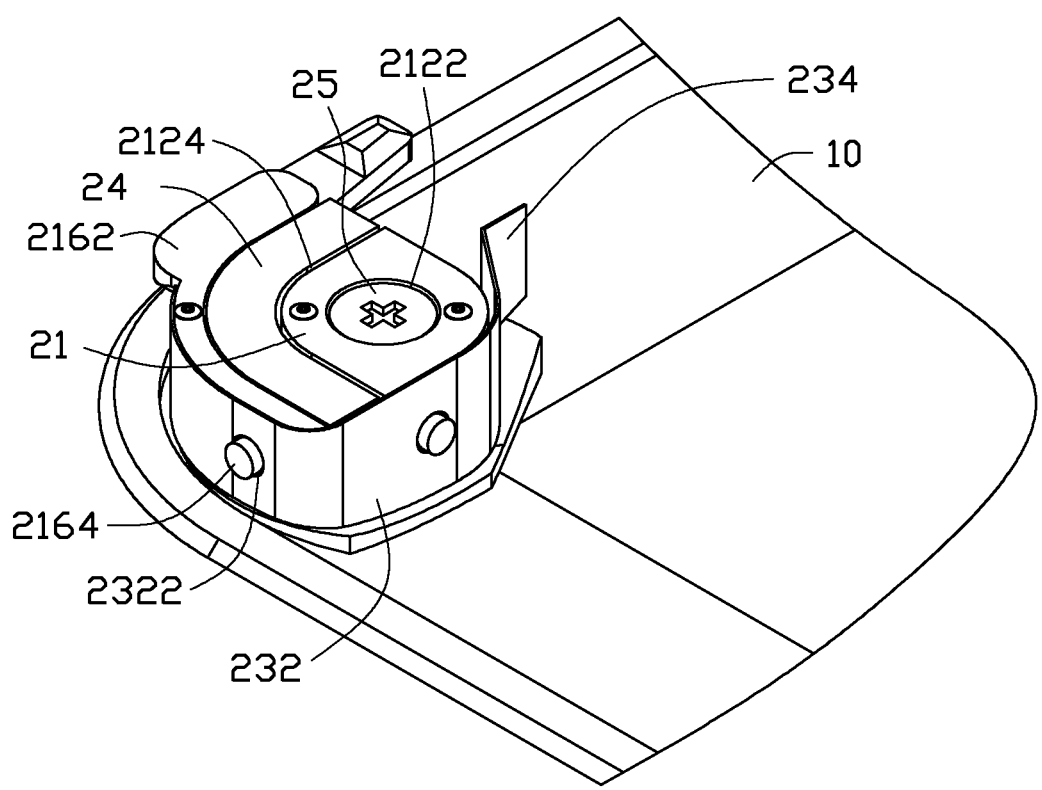
FIG. 4 is a partially assembled view of the latching module attached to the portable electronic device.
Figure 5:
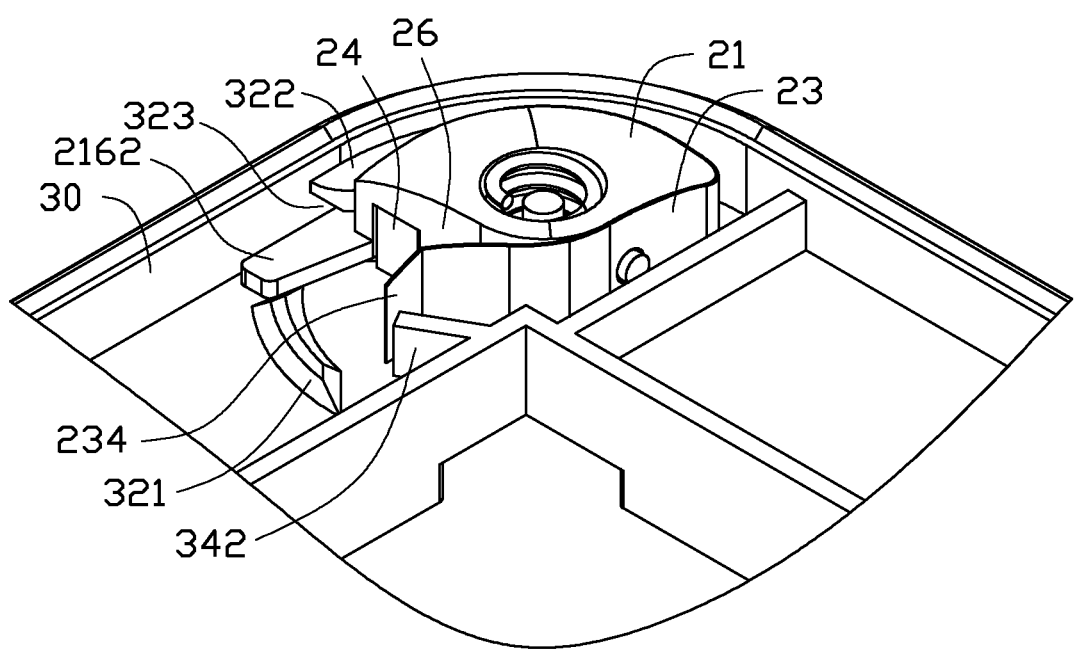
FIG. 5 is an assembled view of the latching module of FIG. 3.
Figure 6:
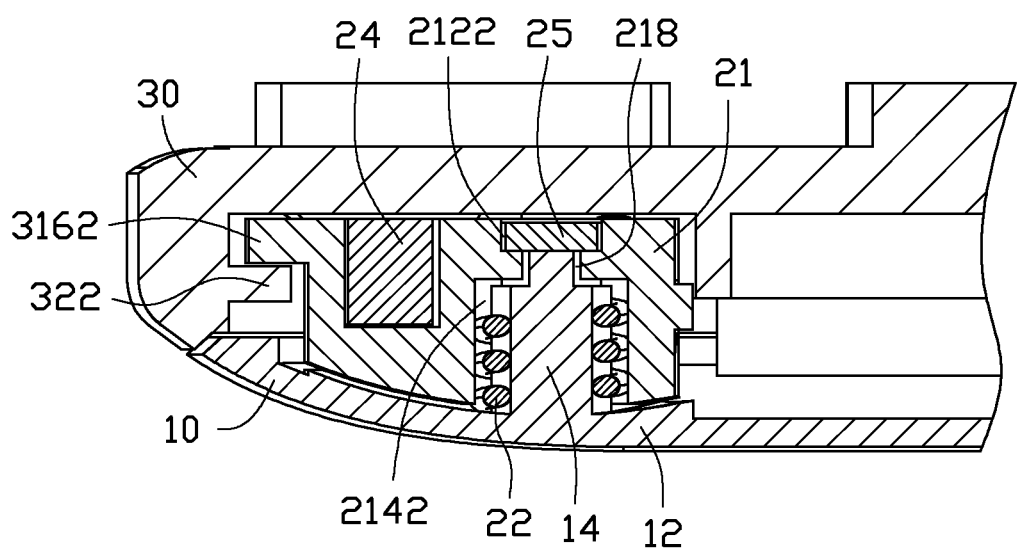
FIG. 6 is a cross sectional view of the latching module of FIG. 1 taken along line VI-VI.
Figure 7:
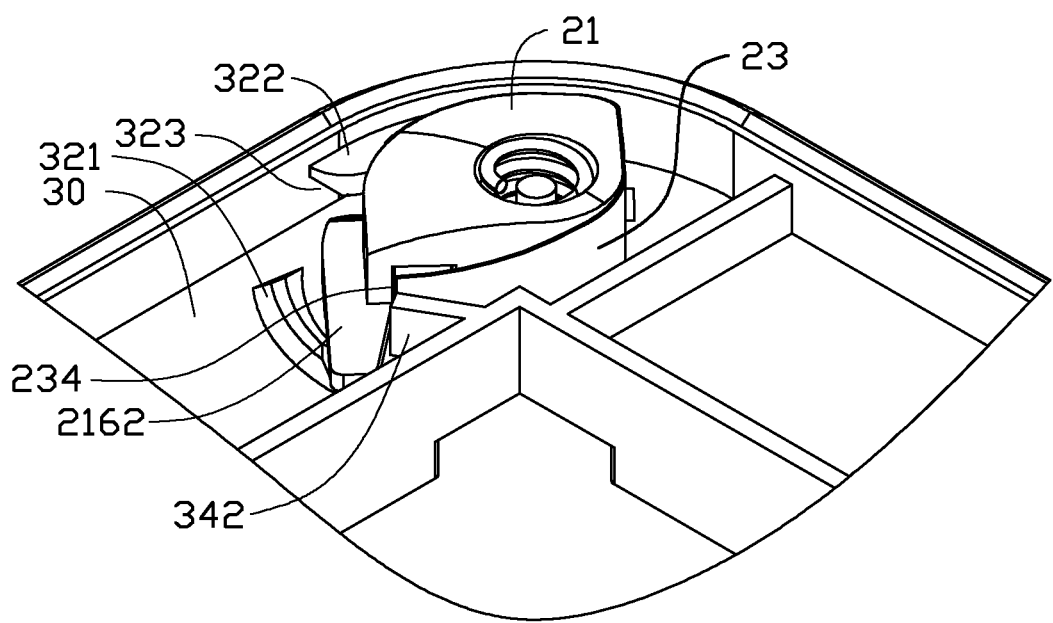
FIG. 7 is an assembled view of the latching module rotated to another state.

Referring to FIG. 3, the latching module 20 comprises a rotary member 21, a compression spring 22, an elastic sheet 23, a magnetic member 24 and a fastener 25.

The rotary member 21 comprises a first surface 212, a second surface 214 opposite to the first surface 212, and a peripheral surface 216. The first surface 212 defines a first receiving hole 2122 and a curved groove 2124. Distal ends of the curved groove 2124 communicate with the peripheral surface 216. The second surface 214 defines a second receiving hole 2142 communicating with the first receiving hole 2122. The second receiving hole 2142 has a larger diameter than the first receiving hole 2122. A latching projection 2162, configured for latching with the second housing 30, extends from the peripheral surface 216. At least one pin 2164 is located on the peripheral surface 216 for mounting the elastic sheet 23.

The compression spring 22 is fitted around the post 14 of the first housing 10 and is received in the second receiving hole 2142. The elastic sheet 23 is made of metal and comprises a mounting portion 232 and a bend portion 234. The mounting portion 232 defines at least one pin hole 2322 for receiving the pin 2164. The bend portion 234 is angled from the mounting portion 232.

The magnetic member 24 is a magnet. The fastener 25 is configured for connecting the rotary member 21 to the first housing 10. In this exemplary embodiment, the fastener 25 is a screw, extending through the first receiving hole 2122, and threaded into the threaded hole 142 of the post 14 received in the second receiving hole 2142.

The second housing 30 comprises a peripheral wall 32 and a main body 34. An inside surface of the main body 34 has a first clasp 321 and a second clasp 322. A latching space 323 is defined between the first clasp 321 and the second clasp 322. A tilted plate 342 is located on the main body 34, and is adjacent to the first clasp 321. A plurality of engaging hooks 324 are located along the peripheral wall 32 corresponding to the hooks 16.

During assembly, referring to FIGS. 4-7, the magnetic member 24 is received in the curved groove 2124 of the rotary member 21 and is mounted to the rotary member 21 by means of adhesive. The elastic sheet 23 is attached to the peripheral surface 216 of the rotary member 21. The pin 2164 is secured into the pin hole 2322 by means of, hot melting process and the mounting portion 232 is thus held against the peripheral surface 216 of the rotary member 21. The compression spring 22 is fitted around the post 14, and the rotary member 21 is engaged with the post 14. The compression spring 22 is received in the second receiving hole 2142. The fastener 25 extends through the first receiving hole 2122 and is fastened to the threaded hole 142. In this way, the rotary member 21 is rotatably assembled on the first housing 10.

The second housing 30 is placed on the first housing 10, and the bend portion 234 elastically abuts the tilted plate 342. The elastic sheet 23 provides a predetermined amount of pressure to the rotary member 21. The latching projection 2162 of the rotary member 21 is supported by the first clasp 321. The engaging hooks 324 engage with the hooks 16. To latch the second housing 30 to the first housing 10, a magnet 200 is provided. The magnet 200 magnetically attracts the magnetic member 24. The magnet 200 faces the second housing 30 corresponding to the position of the rotary member 21. The magnet 200 is rotated to attract the magnetic member 24. As the magnet 200 is rotated, the rotary member 21 is also rotated. The latching projection 2162 moves along the first clasp 321 until the latching projection 2162 is rotated into the latching space 323. Thus, the second housing 30 becomes to be latched on the first housing 10. When the second housing 30 needs to be disassembled from the first housing 10, the magnet 200 only needs to be rotated in reverse. The assembly process of the latching module 20 is simple and convenient.

Although numerous characteristics and advantages of the exemplary disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A latching module comprising:
a rotary member comprising a first surface, a second surface opposite to the first surface, and a peripheral surface; the first surface defining a first receiving hole and a curved groove, and the second surface defining a second receiving hole communicating with the first receiving hole; and a latching projection extending from the peripheral surface;
a compression spring received in the second receiving hole;
an elastic sheet attached to the peripheral surface; and
a magnetic member received in the curved groove;
wherein the magnetic member is attracted by another magnet to rotate the rotary member for selectively locking the latching projection to a housing.

2. The latching module of claim 1, wherein at least one pin is located on the peripheral surface, the elastic sheet comprises a mounting portion and a bend portion, the mounting portion defines at least one pin hole for receiving the at least one pin, and the bend portion is angled from the mounting portion.

3. A portable electronic device, comprising:
a first housing;
a rotary member rotatably engaged with the first housing, the rotary member comprising a latching projection, a first receiving hole, a second receiving hole, and a curved groove; wherein the second receiving hole communicates with the first receiving hole;
a compression spring received in the second receiving hole;
an elastic sheet attached to the rotary member;
a magnetic member received in the curved groove; and
a second housing defining a latching space;
wherein when the magnetic member is attracted by another magnet to rotate the rotary member relative to the first housing, the latching projection is selectively locked into the latching space of the second housing.

4. The portable electronic device of claim 3, wherein the elastic sheet comprises a mounting portion and a bend portion, the mounting portion is secured to the rotary member, and the bend portion is angled from the mounting portion.

5. The portable electronic device of claim 3, further comprising a fastener, wherein the first housing has a post, the post defines a threaded hole, the rotary member is rotatably fitted around the post, and the fastener is secured to the threaded hole.

6. The portable electronic device of claim 3, wherein the second housing comprises a first clasp and a second clasp, and the latching space is defined between the first clasp and the second clasp.

7. The portable electronic device of claim 6, wherein a tilted plate is located on the second housing adjacent to the first clasp, and a distal end of the elastic sheet abuts the tilted plate.

* * * * *